United States Patent
Li

(10) Patent No.: US 8,277,178 B2
(45) Date of Patent: Oct. 2, 2012

(54) FAN ASSEMBLY

(75) Inventor: Ying-Liang Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 516 days.

(21) Appl. No.: 12/547,446

(22) Filed: Aug. 25, 2009

(65) Prior Publication Data

US 2010/0329860 A1 Dec. 30, 2010

(30) Foreign Application Priority Data

Jun. 26, 2009 (CN) .......................... 2009 1 0303753

(51) Int. Cl.
 *F01D 25/26* (2006.01)
(52) U.S. Cl. .................. 415/213.1; 415/214.1; 415/220
(58) Field of Classification Search .................... 415/68, 415/199.4, 213.1, 214.1, 200; 361/695–697; 403/361, 326
See application file for complete search history.

(56) References Cited

U.S. PATENT DOCUMENTS

| 5,647,618 A * | 7/1997 | Lamberth | 292/19 |
| 6,434,002 B1 * | 8/2002 | Wei | 361/697 |
| 6,827,549 B1 * | 12/2004 | Horng et al. | 415/68 |
| 7,597,535 B2 * | 10/2009 | Wu et al. | 415/119 |
| 7,654,792 B2 * | 2/2010 | Kikuichi et al. | 415/68 |
| 7,789,126 B2 * | 9/2010 | Lofland et al. | 165/121 |
| 2005/0232754 A1 * | 10/2005 | Ku et al. | 415/121.2 |
| 2005/0260065 A1 * | 11/2005 | Kikuichi et al. | 415/60 |
| 2010/0020493 A1 * | 1/2010 | Lee et al. | 361/695 |

* cited by examiner

*Primary Examiner* — Ninh H Nguyen
*Assistant Examiner* — Liam McDowell
(74) *Attorney, Agent, or Firm* — Altis Law Group, Inc.

(57) ABSTRACT

A fan assembly includes a first fan and a second fan mounted on the first fan. The first and second fans respectively include first and second frames. The first frame includes four pairs of first projections on a top thereof. The first projections of each pair are arranged face to face, and each includes a first hook towards the other one. The second projection includes four pairs of second projections on a bottom thereof. The second projections of each pair are arranged back to back, and each protrudes a second hook pointing away from the other one. The pair of second projections are received between a corresponding pair of first projections with the second hooks respectively engaging with the first hooks.

7 Claims, 7 Drawing Sheets

FAN ASSEMBLY

BACKGROUND

1. Technical Field

The present disclosure relates to fan assemblies, and more particularly to a fan assembly which can be conveniently assembled.

2. Description of Related Art

With continuing development of the electronic technology, electronic components such as CPUs (central processing units) generate more and more heat required to be dissipated immediately. Therefore, fan assemblies are widely used to help dissipating heat of the electronic components.

A typical fan assembly includes at least two fans assembled together. Each of the fans includes a frame and an impeller rotatably received in the frame. The frames of the fans are assembled together via a plurality of individual fasteners, such as screws or bolts, etc. However, assembling the fans via these fasteners is inconvenient and time-consuming. In addition, these fasteners also increase the manufacture cost of the fan assembly.

For the foregoing reasons, a fan assembly which can overcome the described shortcomings is desired.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Reference will now be made to the drawings to describe various present embodiments in detail.

Figure 1:
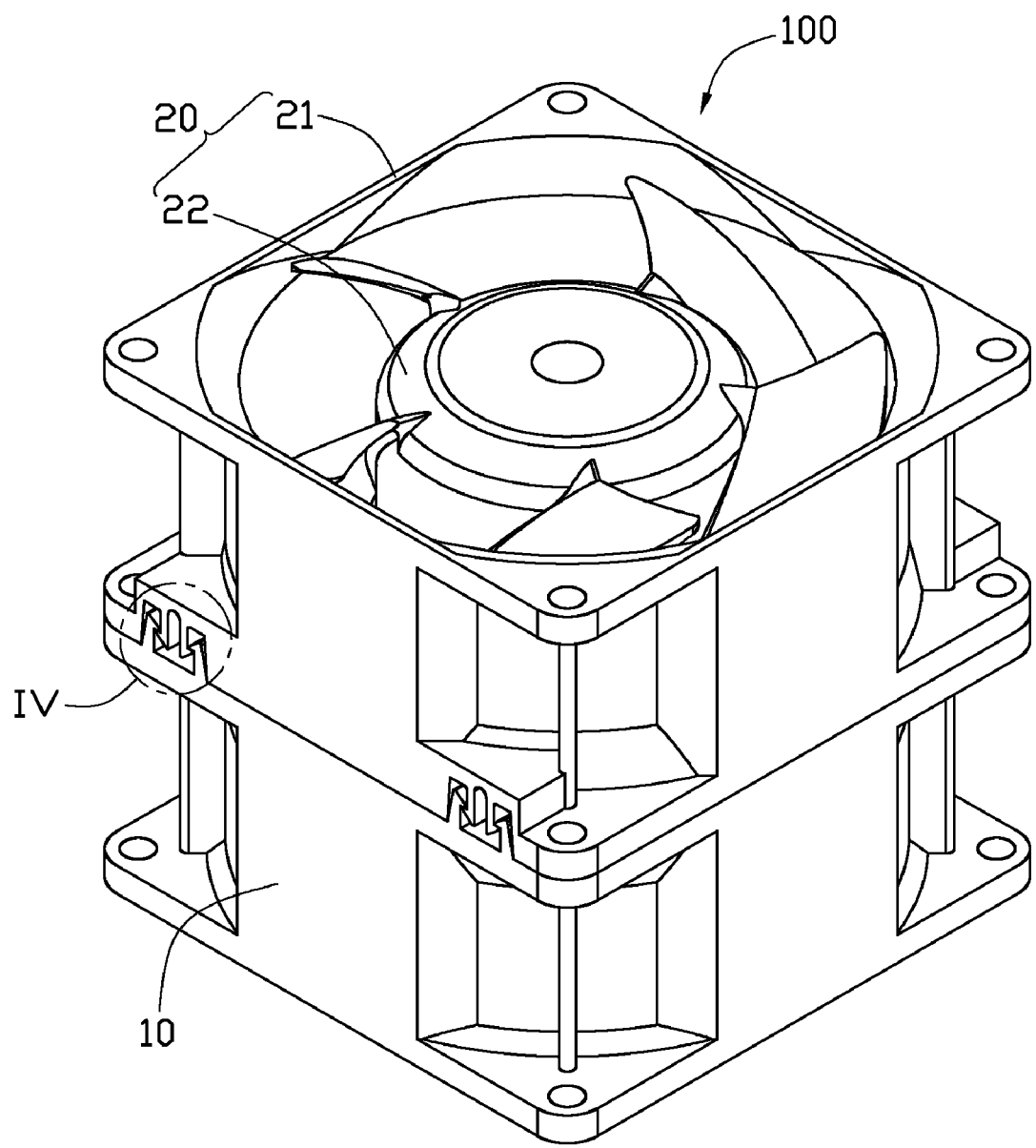
FIG. 1 is an assembled, isometric view of a fan assembly according to a first embodiment of the present disclosure.

Referring to FIG. 1, a fan assembly according to a first embodiment of the present disclosure includes a first fan 10 and a second fan 20 mounted on the first fan 10. The second fan 20 is located above the first fan 10.

Figure 2:
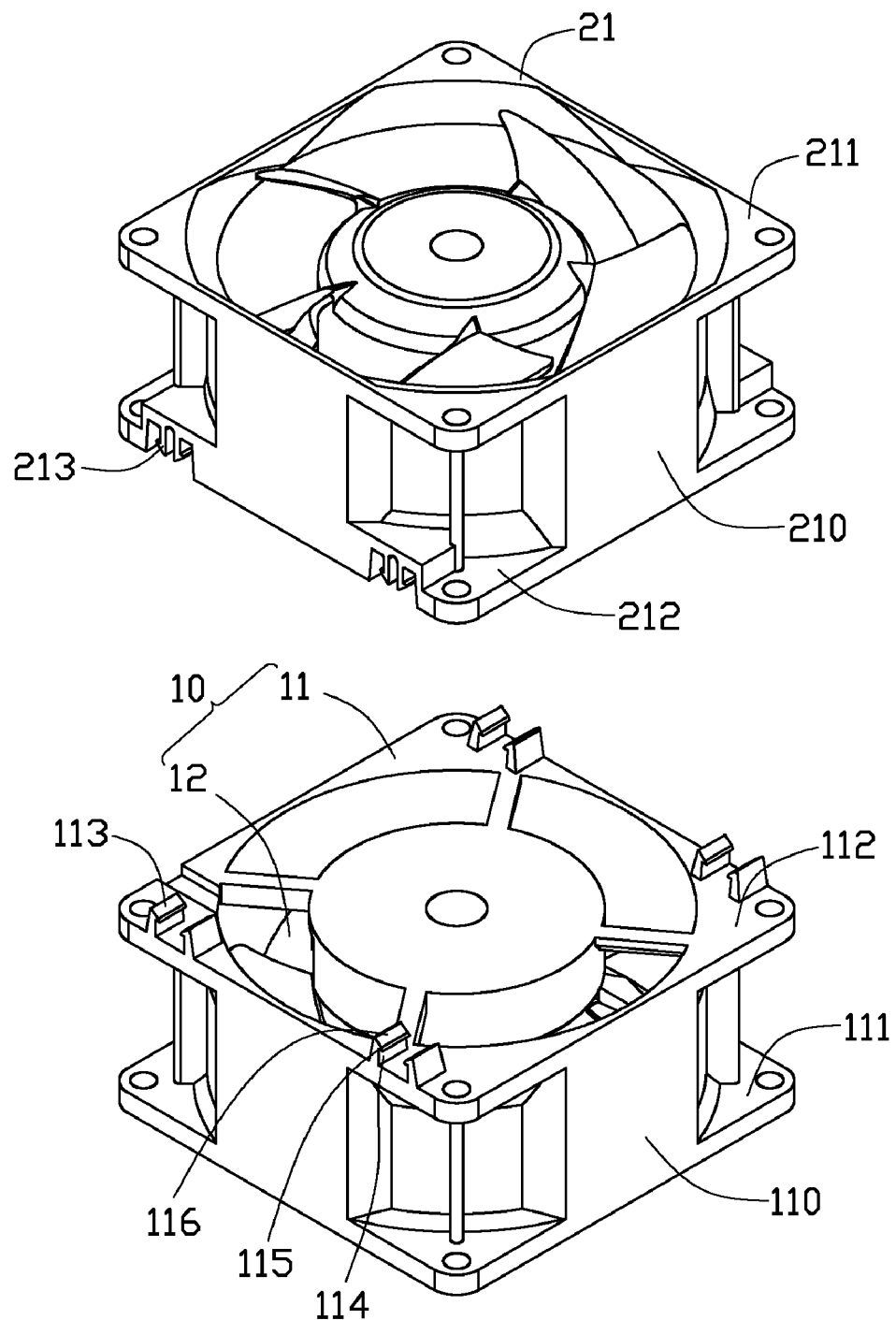
FIG. 2 is an exploded, isometric view of the fan assembly of FIG. 1.

Referring to FIG. 2, the first fan 10 includes a frame 11 and an impeller 12 rotatably received in the frame 11. The frame 11 includes a tubular body 110, a bottom flange 111 extending horizontally outwardly from a bottom end of the tubular body 110, and a top flange 112 extending horizontally outwardly from a top end of the tubular body 110. The bottom flange 111 and the top flange 112 each are substantially rectangular. Eight first projections 113 extend upwardly from the top flange 112 of the first fan 10 toward the second fan 20. The eight first projections 113 are divided into four pairs. The four pairs of first projections 113 are respectively positioned at four corners of the top flange 112. Each pair of first projections 113 includes two first projections 113 arranged closely side by side and face each other. The inner surfaces 114 of each pair of first projections 113 are parallel to and face each other. Each of the first projections 113 includes a hook 115 protruding horizontally inwardly from a top free end thereof. The hook 115 of one of each pair of first projections 113 protrudes toward the other one of the pair of first projections 113. The hook 115 is wedge-shaped and protrudes out of the inner surface 114 of the first projection 113. An inclined surface 116 is formed at a top end of each hook 115.

Figure 3:
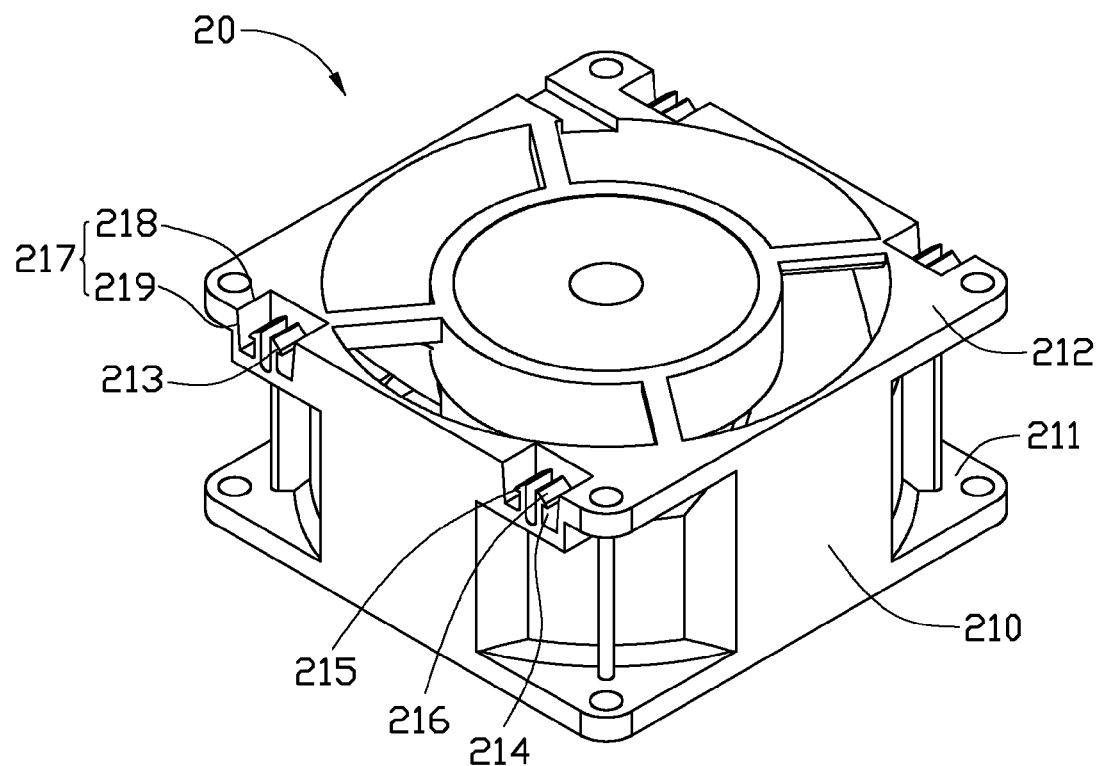
FIG. 3 is an isometric view of a second fan of the fan assembly of FIG. 2, viewed from a bottom aspect.

Referring also to FIG. 3, the second fan 20 is similar to the first fan 10. The second fan 20 includes a frame 21 and an impeller 22 (referring to FIG. 1) rotatably received in the frame 21. The frame 21 includes a tubular body 210, a top flange 211 extending horizontally outwardly from a top end of the tubular body 210, and a bottom flange 212 extending horizontally outwardly from a bottom end of the tubular body 210. The bottom flange 212 defines four grooves 217 in four corners thereof, respectively. Each of the grooves 217 corresponds to a pair of first projections 113 of the first fan 10. The groove 217 includes a bottom opening 218 facing the first fan 10 and a side opening 219 perpendicular to the bottom opening 218 and facing a front side or a rear side of the bottom flange 212. Each of the grooves 217 has a pair of second projections 213 protruding downwardly from a bottom of the groove 217 toward the bottom opening 218. The second projections 213 are similar to the first projections 113. However, each pair of the second projections 213 are arranged back to back. The outer surfaces 214 of each pair of second projections 213 are arranged back to back. Each second projection 213 includes a hook 215 at a bottom free end thereof. The hook 215 of one of each pair of second projections 213 points away from the other one of the pair of second projections 213. The hook 215 is wedge-shaped and protrudes out of the outer surface 214 of the second projection 213. An inclined surface 216 is formed at a bottom end of each hook 215. In addition to being exposed downwardly, each pair of second projections 213 are also exposed sideways from the groove 217 to an outside via the side opening 219 of the groove 217. A distance between the outer surfaces 214 of a pair of second projections 213 is slightly smaller than that between the inner surfaces 114 of a pair of first projections 113.

Figure 4:
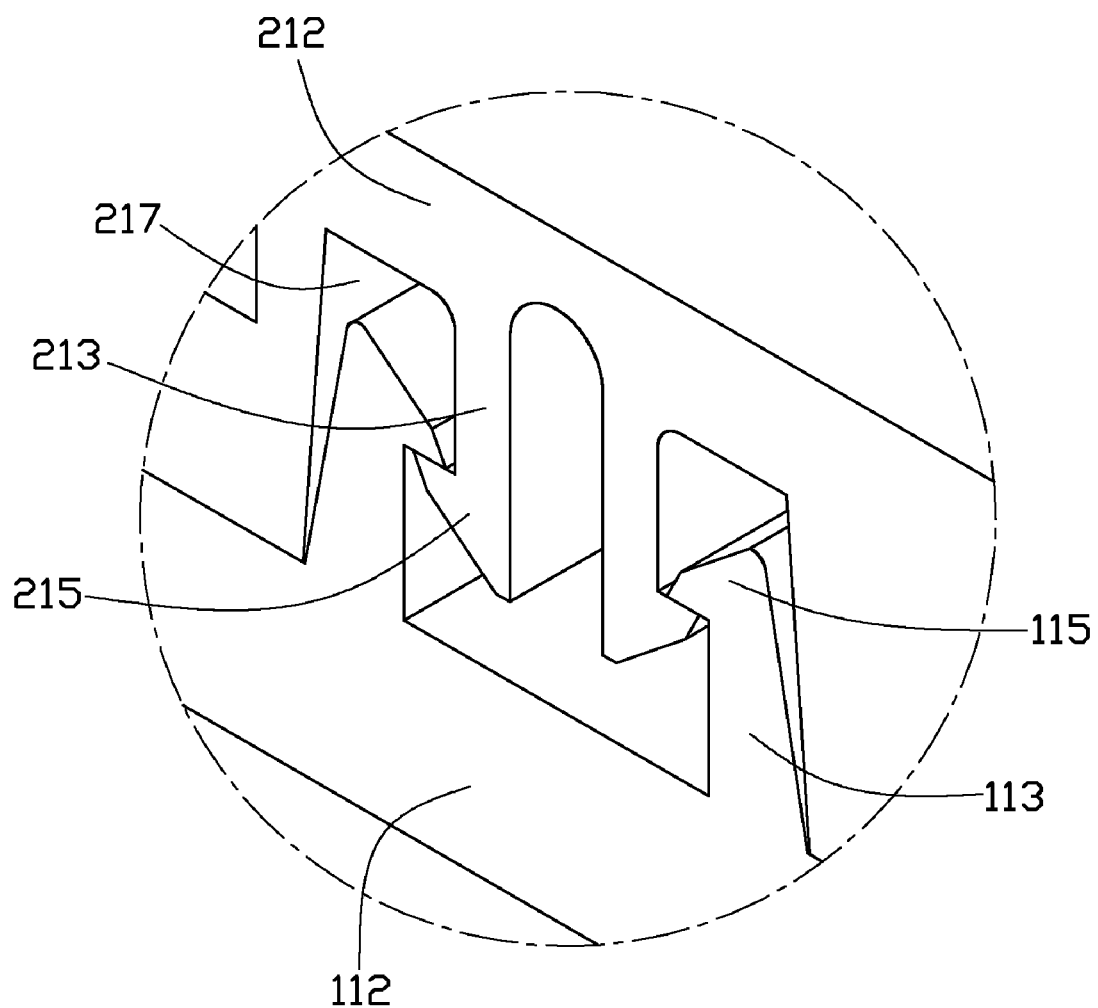
FIG. 4 is an enlarged view of a circled portion IV of FIG. 1.

Referring to FIG. 4, in assembling the fan assembly, the tubular body 110 of the first fan 10 is aligned with the tubular body 210 of the second fan 20, and each pair of first projections 113 face the bottom opening 218 of a corresponding groove 217 of the second fan 20 with the inclined surfaces 116 facing corresponding inclined surfaces 216. The first and second fans 10, 20 are pushed towards each other. The inclined surfaces 116 of each pair of first projections 113 slip along the inclined surfaces 216 of the corresponding pair of second projections 213. The pair of first projections 113 deform outwardly, and the pair of second projections 213 deform inwardly. After the hooks 115 of the pair of first projections 113 pass over the hooks 215 of the corresponding pair of second projections 213, the first and second projections 113, 213 rebound to there original shapes, and the hooks 115 of the pair of first projections 113 snappingly engage with the hooks 215 of the corresponding pair of second projections 213. Therefore, the second fan 20 is conveniently mounted on the first fan 10. In this state, each pair of second projections 213 are positioned between the corresponding pair of first projections 113. Each pair of first projections 113 and the corresponding pair of second projections 213 are exposed sideways to the outside through the side opening 219 of the corresponding groove 217 of the second fan 20, so that the operator or user can conveniently operate the first and the second projections 113, 213 when the fan assembly 100 is required to be disassembled. In addition, the first and second projections 113, 213 are integrally formed with the first and second fans 10, 20 respectively, to thereby reduce the manufacture cost of the fan assembly. Furthermore, in assembly of the fan assembly, the first and second projections 113, 213 deform simultaneously, each of the first and second projections 113, 213 only needs to occur a little deformation, to thereby reduce a risk of break of the first and second projections 113, 213.

Figure 5:
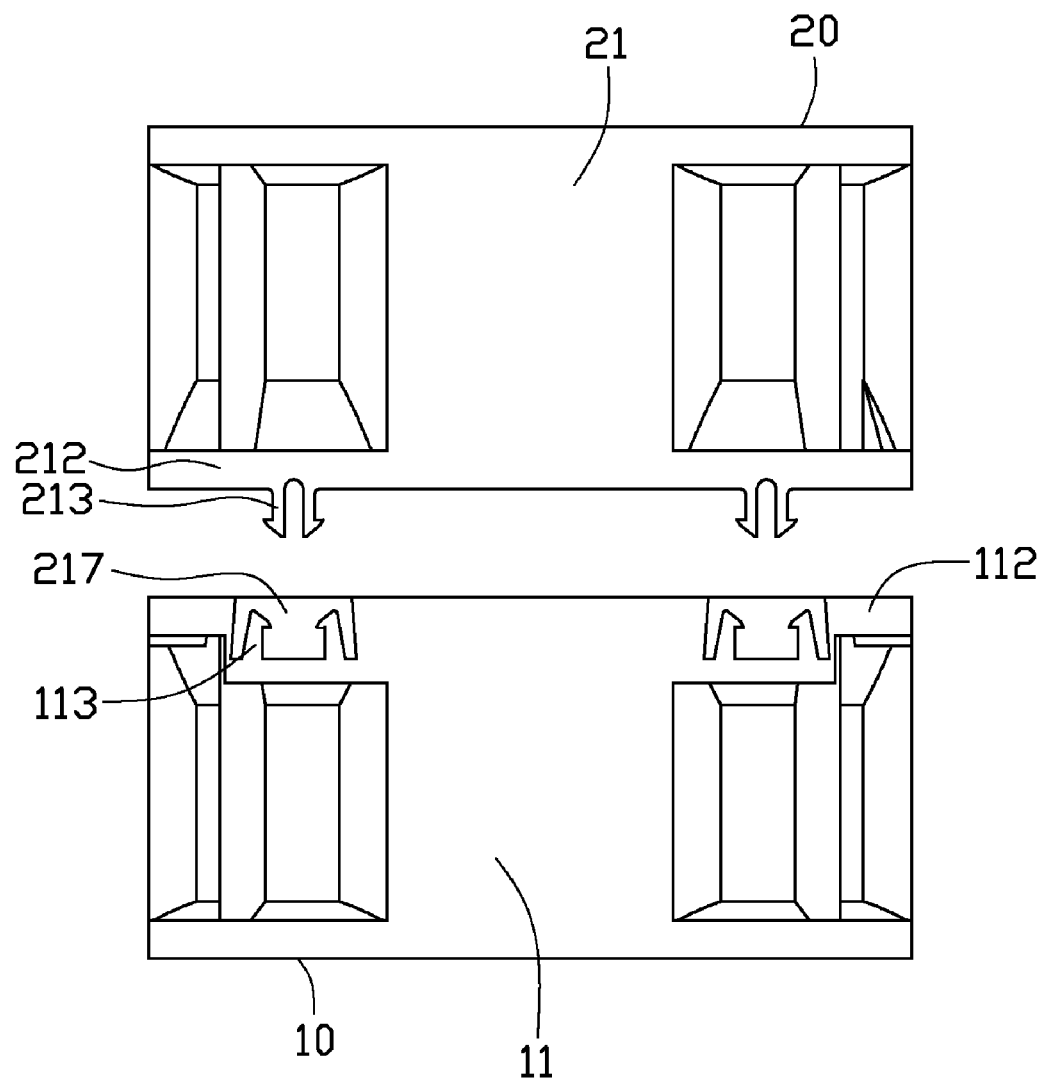
FIG. 5 is a front elevational, exploded view of a fan assembly according to a second embodiment of the present disclosure.

In the aforementioned embodiment, the grooves 217 are defined in the second fan 20, and each pair of second projections 213 are formed in the groove 217, and the first projections 113 extend directly upwardly from the top flange 112 of the first fan 10. Alternatively, referring to FIG. 5, the grooves 217 can be defined in four corners of the top flange 112 of the first fan 10 and each pair of first projections 113 is received in a corresponding groove 217 of the first fan 10, and the second projections 213 extend directly downwardly from the bottom flange 212 of the second fan 20.

Figure 6:
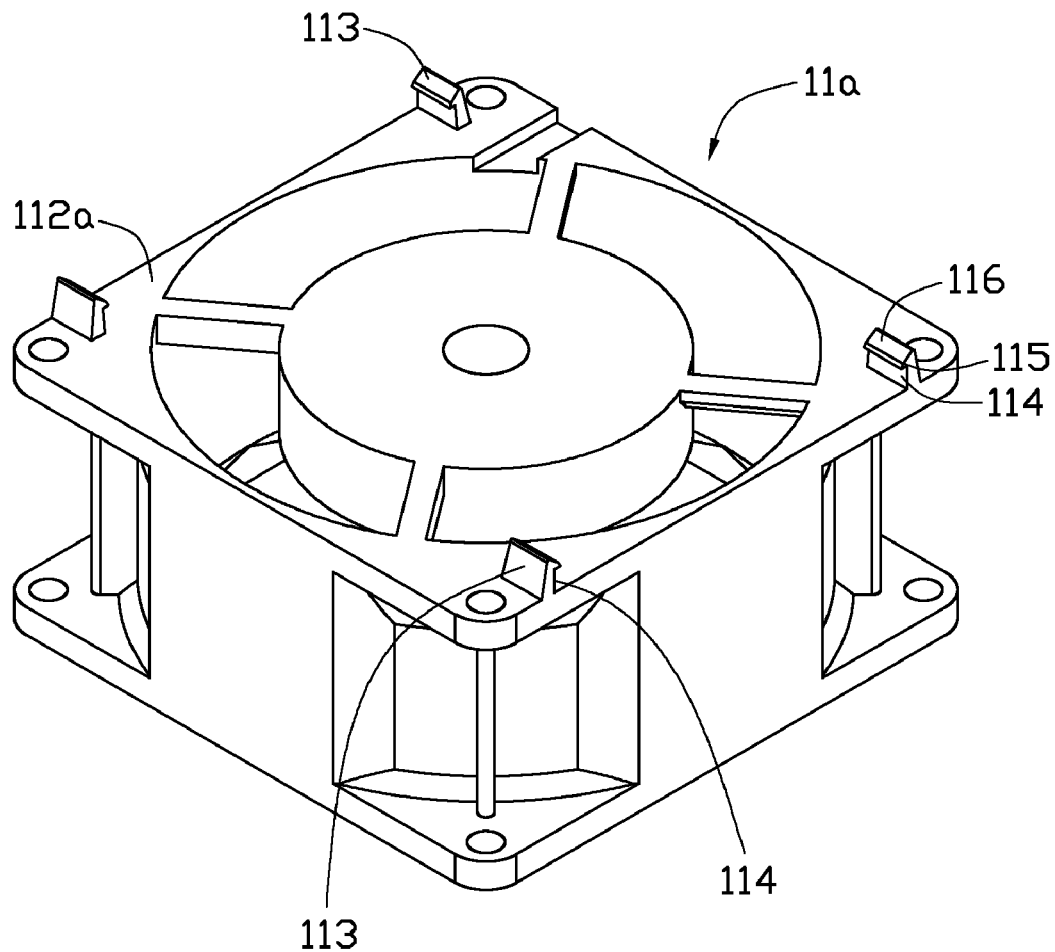
FIG. 6 is an isometric view of a first fan of a fan assembly according to a third embodiment of the present disclosure.
Figure 7:
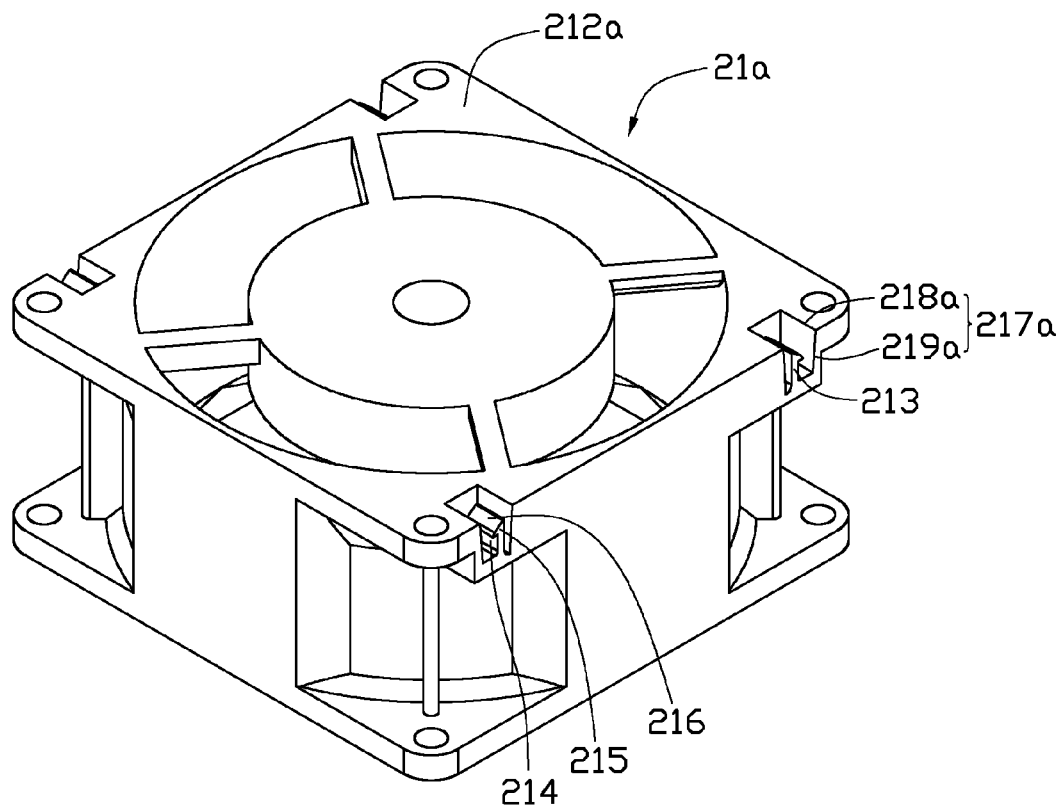
FIG. 7 is an isometric view of a second fan of the fan assembly according to the third embodiment of the present disclosure.

FIG. 6 shows a frame 11a of a first fan of a fan assembly according to a third embodiment of the present disclosure. FIG. 7 shows a frame 21a of a second fan of the fan assembly of the third embodiment. The frames 11a, 21a are similar to the frames 11, 21 in the first embodiment, differing from the first embodiment in that the top flange 112a of the frame 11a protrudes four first projections 113 respectively at four corners thereof, and the bottom flange 212a of the frame 21a defines four grooves 217a at four corners thereof corresponding to the four first projections 113 of the frame 11a. Each of the grooves 217a protrudes upwardly a second projection 213 corresponding to one of the first projections 113 of the frame 11a. The four first projections 113 are grouped into two pairs. The two pairs of first projections 113 are respectively positioned at two opposite sides of the top flange 112a. Each pair of first projections 113 includes two first projections 113 provided at two neighboring corners of the top flange 112a, and the two first projections 113 are arranged face to face. Each of the grooves 217a includes a bottom opening 218a facing the corresponding first projection 113, and a side opening 219a perpendicular to the bottom opening 218a and facing a front side or a rear side of the frame 21a. The four second projections 213 are also divided into two pairs. Each pair of second projections 213 includes two second projections 213 provided at two neighboring corners of the bottom flange 212a, and the two second projections 213 are respectively received in two adjacent grooves 217a and arranged back to back. When the frame 21a is mounted on the frame 11a, each of the first projections 113 engages with a corresponding second projection 213, and the first projection 113 and the corresponding second projection 213 are exposed to an outside through the side opening 219a of the groove 217a.

It is to be understood that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan assembly comprising:
a first fan comprising a first frame, the first frame comprising at least a pair of first projections formed at a top thereof, the at least a pair of first projections being arranged face to face, each one of the at least a pair of first projections comprising a first hook protruding towards the other one of the at least a pair of first projections, so that each of the at least a pair of first projections is L-shaped;
a second fan comprising a second frame, the second frame comprising at least a pair of second projections formed at a bottom thereof, the at least a pair of second projections being arranged back to back, each one of the at least a pair of second projections comprising a second hook pointing away from the other one of the at least a pair of second projections, so that each of the at least a pair of second projections is L-shaped;
wherein the at least a pair of second projections is received between the at least a pair of first projections with the second hooks of the at least a pair of second projections respectively engaging with the first hooks of the at least a pair of first projections; and
wherein one of the first frame and the second frame defines at least a groove therein for receiving the at least a pair of first projections and the at least a pair of second projections therein, each pair of the first projections and a corresponding pair of second projections are received in a same one of the at least a groove, the at least a groove comprising a first opening facing the other one of the first frame and the second frame and a second opening which is perpendicular to the first opening and facing a lateral side of the one of the first frame and second frame, the at least a pair of first projections and the at least a pair of second projections are exposed to the lateral side through the second opening of the at least a groove.

2. The fan assembly of claim 1, wherein the at least a groove comprises a plurality of grooves defined in the second frame, the at least a pair of second projections comprises a plurality of pairs of second projections, each pair of second projections are formed in corresponding one of the plurality of grooves, each of the second projections protrudes from a bottom of a corresponding groove towards the first opening of the corresponding groove, the at least a pair of first projections comprises a plurality of pairs of first projections, each first projection of the first fan enters into the corresponding groove of the second fan from the first opening of the corresponding groove to engage with a corresponding second projection.

3. The fan assembly of claim 2, wherein the first frame comprises four pairs of first projections formed thereon, each pair of first projections comprises two first projections arranged closely to each other, the second frame comprises four pairs of second projections formed thereon, each pair of second projections comprises two second projections arranged closely to each other, the second frame defines four grooves therein, each of the grooves faces a pair of first projections of the first fan, and each pairs of second flakes is received in a corresponding groove.

4. The fan assembly of claim 2, wherein the first hook and the second hook are wedge-shaped, a first inclined surface is formed on a top end of each first hook, a second inclined surface is formed on a bottom end of each second hook, the first inclined surface of each first projection slips along the second inclined surface of a corresponding second projection in assembling the fan assembly.

5. The fan assembly of claim 2, wherein a top of the first frame extends horizontally outwardly to form a first flange, the first projections protrude upwardly from the first flange, a bottom of the second frame extends horizontally outwardly to form a second flange, the second projections protrude downwardly from the second flange.

6. The fan assembly of claim 2, wherein the first fan further comprises a first impeller rotatably mounted in the first frame thereof, the second fan further comprises a second impeller rotatably mounted in the second frame thereof.

7. The fan assembly of claim 1, wherein the first frame comprises two pairs of first projections formed thereon, each pair of first projections comprises two first projections provided at two neighboring corners of the first frame and the two first flakes are arranged face to face, the second frame defines four grooves at four corners thereof, respectively, each of the grooves faces one of the first flakes of the first fan, the second frame has two pairs of second flakes formed thereon, each of the grooves has one of the second flakes formed therein.

* * * * *